(12) United States Patent
Furuie

(10) Patent No.: US 9,793,513 B2
(45) Date of Patent: Oct. 17, 2017

(54) DISPLAY DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/281,213

(22) Filed: Sep. 30, 2016

(65) Prior Publication Data

US 2017/0133628 A1    May 11, 2017

Related U.S. Application Data

(63) Continuation of application No. 14/318,863, filed on Jun. 30, 2014, now Pat. No. 9,484,550.

(30) Foreign Application Priority Data

Jul. 3, 2013 (JP) .................................. 2013-139743

(51) Int. Cl.
| | |
|---|---|
| *H01L 29/08* | (2006.01) |
| *H01L 35/24* | (2006.01) |
| *H01L 51/00* | (2006.01) |
| *H01L 51/52* | (2006.01) |
| *H01L 27/32* | (2006.01) |

(52) U.S. Cl.
CPC ...... *H01L 51/5253* (2013.01); *H01L 27/3246* (2013.01)

(58) Field of Classification Search
USPC ............................................. 257/40; 438/26
See application file for complete search history.

(56) References Cited

U.S. PATENT DOCUMENTS

2005/0023964 A1    2/2005 Omura et al.
2009/0309489 A1   12/2009 Takata et al.
(Continued)

FOREIGN PATENT DOCUMENTS

JP    2004-335267 A    11/2004
JP    2008-47515 A      2/2008
(Continued)

OTHER PUBLICATIONS

Japanese Office Action dated Feb. 7, 2017, for corresponding JP Patent Application No. 2013-139743, with partial translation.
(Continued)

*Primary Examiner* — Telly Green
(74) *Attorney, Agent, or Firm* — Typha IP LLC

(57) ABSTRACT

A light-emitting element display device includes: a display area which has an organic insulating layer that is made of an organic insulating material; a peripheral circuit area which is disposed around the display area and which has the organic insulating layer; and a blocking area that is formed between the display area and the peripheral circuit area. The blocking area includes: a first blocking area configured by only one or a plurality of inorganic material layers between an insulating base substrate and an electrode layer which covers the display area and is formed continuously from the display area, and which configures one of two electrodes for allowing the light emitting area to emit the light; and a second blocking area including a plurality of layers configuring the first blocking area, and a light emitting organic layer.

6 Claims, 8 Drawing Sheets

(56) References Cited

U.S. PATENT DOCUMENTS

2011/0111585 A1* 5/2011 Ohnuma ............ H01L 21/0273
438/592
2014/0146410 A1   5/2014 Lo
2014/0317906 A1  10/2014 Lo

FOREIGN PATENT DOCUMENTS

JP  2009-295911 A  12/2009
KR  10-2007-0080834 A  8/2007
KR  10-2009-0061387 A  6/2009

OTHER PUBLICATIONS

Korean Office Action dated Sep. 10, 2015 regarding Korean Patent Application No. 10-2014-0080793, citing the above reference(s).

* cited by examiner

DISPLAY DEVICE

CROSS-REFERENCE TO RELATED APPLICATION

This application is a continuation of U.S. patent application Ser. No. 14/318,863, filed Jun. 30, 2014. Further, this application claims priority from Japanese application JP2013-139743 filed on Jul. 3, 2013, the contents of which are hereby incorporated by reference into this application.

BACKGROUND OF THE INVENTION

1. Field of the Invention

The present invention relates to a light-emitting element display device, and more particularly to a light-emitting element display device that allows light-emitting elements which are self-luminous bodies arranged in respective pixels to emit a light for displaying.

2. Description of the Related Art

In recent years, an image display device using self-luminous bodies called "organic light emitting diode (OLED)" has been put into practical use, hereinafter the image display device is called "organic EL (electro-luminescent) display device". As compared with a related-art liquid crystal display device, the organic EL display device is not only excellent in visibility and response speed because the self-luminous bodies are used, but also can be further thinned because no auxiliary illuminating device such as a backlight is required.

The organic EL display device thus configured is deteriorated with the absorption of moisture. For that reason, an organic EL panel includes a countermeasure that a sealing glass substrate is stuck onto a TFT (thin film transistor) substrate on which a light emitting layer is formed with a resin for sealing.

JP 2004-335267 A and JP 2008-047515 A disclose a structure in which an organic film is divided between a display area and an area around an outside of the display area in view of an entry route in which the moisture arrives at the display area from the area around the outside of the display area through the organic film.

SUMMARY OF THE INVENTION

A sealing film is formed on a surface of a TFT substrate so as to cover an overall surface of the display area and a peripheral circuit area. However, if a foreign matter adheres to any portion in a process before the sealing film is formed, the portion cannot be sufficiently covered with the sealing film, as a result of which the portion may configure the entry route of the moisture from the external. In particular, in a deposition process before the sealing film is formed, the foreign matter that has adhered to a vapor deposition mask may be transferred to the TFT substrate side during the deposition process. In this case, it is conceivable that sealing using the sealing film is insufficient.

The present invention has been made in view of the above-mentioned circumstance, and therefore an object of the present invention is to provide an organic EL display device that can suppress a display failure attributable to the moisture entry, and maintain a long-term quality.

According to the present invention, there is provided a light-emitting element display device including: a display area in which pixels each having a light emitting area that spontaneously emits a light are arranged in a matrix and which has an organic insulating layer that is made of an organic insulating material; a peripheral circuit area which is disposed around the display area, in which a metal wiring 370 or a circuit using a thin film transistor is arranged and which has the organic insulating layer; and a blocking area that is formed between the display area and the peripheral circuit area, in which the blocking area includes: a first blocking area configured by only one or a plurality of layers made of inorganic material between an insulating substrate made of a base material and an electrode layer which covers the display area and is formed continuously from the display area, and which configures one of two electrodes for allowing the light emitting area to emit the light; and a second blocking area including a plurality of layers configuring the first blocking area, and a light emitting organic layer.

In this example, the light emitting organic layer means at least one of layers formed between the two electrodes, and specifically includes a hole injection layer, a hole transport layer, an electron injection layer, and an electron transport layer in addition to a light emitting layer that emits a light.

Also, in the light-emitting element display device according to the present invention, the light emitting organic layer may include a light emitting layer that covers the display area made of an organic light emitting material.

Also, in the light-emitting element display device according to the present invention, the light emitting organic layer includes any one of a hole injection layer, a hole transport layer, an electron injection layer, and an electron transport layer.

According to the present invention, there is provided a method of manufacturing a light-emitting element display device, including the steps of: forming a circuit including a TFT (thin film transistor) in a display area and a peripheral circuit area around the display area on an insulating substrate; forming an electrode electrically connected to the circuit in each of pixels within the display area, and an organic insulating film formed around the electrode; depositing a light emitting organic layer with the use of an evaporation mask having a mask area that covers the peripheral circuit area, and comes in contact with only the peripheral circuit area; and forming a sealing film that covers at least the light emitting organic layer for sealing an overall surface of the insulating substrate.

Also, in the method of manufacturing a light-emitting element display device according to the present invention, in the step of forming the light emitting organic layer, an inner end of the evaporation mask is arranged within a blocking area that is formed between the display area and the peripheral circuit area.

DETAILED DESCRIPTION OF THE INVENTION

Figure 1:
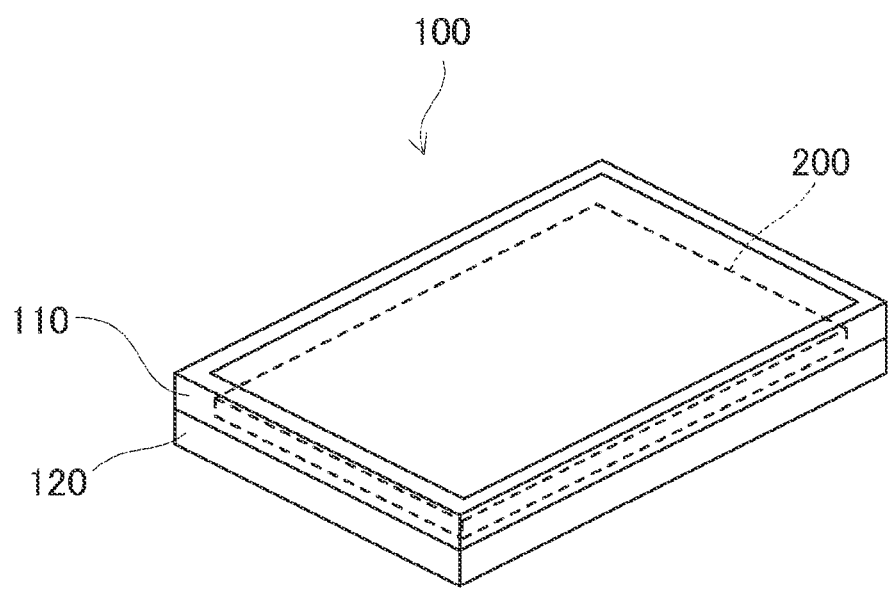
FIG. 1 is a diagram schematically illustrating an organic EL display device according to an embodiment of the present invention.

Hereinafter, embodiments of the present invention will be described with reference to the accompanying drawings. In the drawings, the same or equivalent elements are denoted by identical symbols, and a repetitive description thereof will be omitted.

FIG. 1 is a diagram schematically illustrating an organic EL display device 100 according to an embodiment of the present invention. As illustrated in the figure, the organic EL display device 100 is configured by an organic EL panel 200 fixedly sandwiched between an upper frame 110 and a lower frame 120. The organic EL panel 200 is configured by a TFT substrate 300 which will be described later, and a sealing substrate not shown which is adhered to the TFT substrate 300 with a transparent resin.

Figure 2:
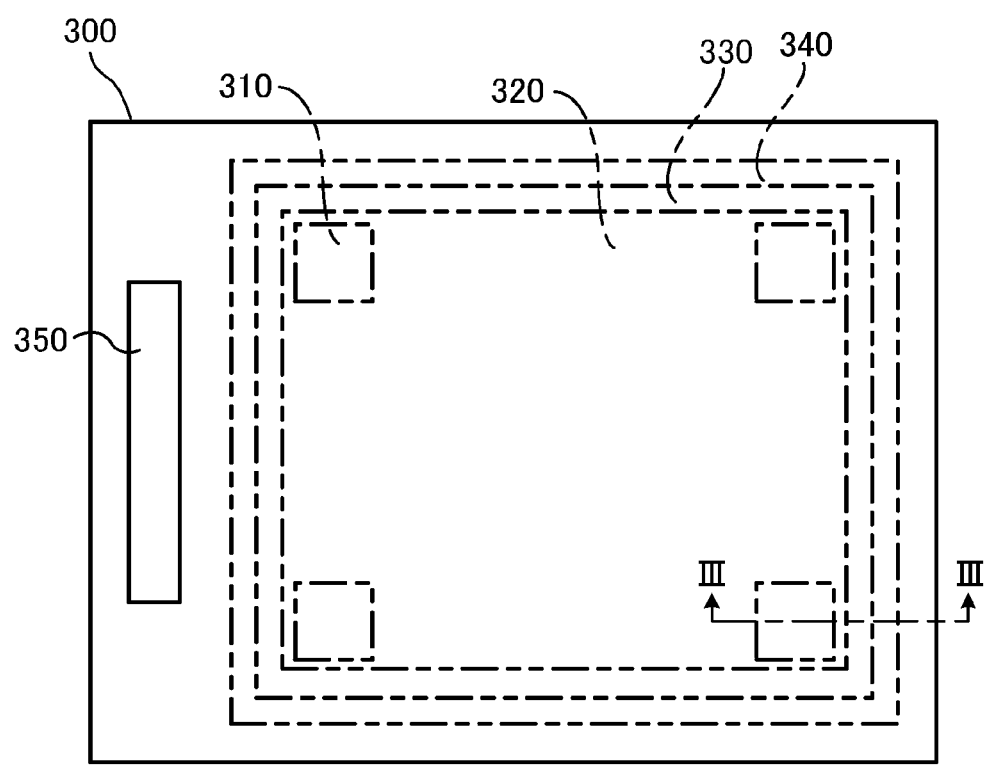
FIG. 2 is a plan view illustrating a configuration of a TFT substrate in the organic EL display device.

FIG. 2 is a plan view illustrating a configuration of the TFT substrate 300. As illustrated in the figure, the TFT substrate 300 includes a display area 320 in which pixels 310 each having an anode electrode 359 (to be described later) arranged therein, and emitting a light on the basis of a gradation value are arranged in a matrix, a peripheral circuit area 340 that is arranged around the display area 320 in which various signal generator circuits for driving pixel circuits, and a circuit that applies a potential to a cathode electrode 357 (to be described later) are formed, and a blocking area 330 that is formed between the display area 320 and the peripheral circuit area 340. Also, a driving IC (integrated circuit) 350 that conducts a control for allowing the respective pixels 310 in the display area 320 to emit the light in correspondence with the gradation value is arranged on the TFT substrate 300.

Figure 3:
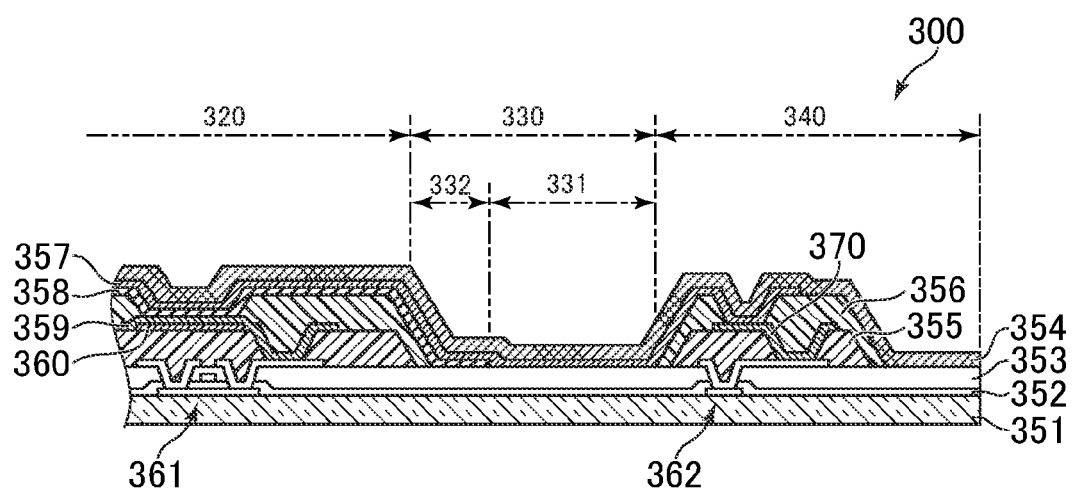
FIG. 3 is a cross-sectional view taken along a line III-III of FIG. 2.

FIG. 3 is a cross-sectional view taken along a line III-III of FIG. 2. As illustrated in FIG. 3, the TFT substrate 300 includes a pixel circuit 361 and a peripheral circuit 362 made of, for example, an LTPS (low-temperature polysilicon) within inorganic insulating films 352 and 353, and an organic flattening film 355 which is an organic insulating film for flattening an area in which the pixel circuit 361 and the peripheral circuit 362 are mainly formed, over a glass substrate 351 which is an insulating substrate. The TFT substrate 300 also includes an organic bank 356 which is an organic insulating film formed to cover an end of a conductive film such as an anode electrode 359 formed in a through-hole of the organic flattening film 355, and a reflection film 360 that is arranged on the glass substrate 351 side of the anode electrode 359 for reflecting a received light. The TFT substrate 300 further includes a light emitting organic layer 358 formed of a light emitting layer that emits the light, and/or hole injection/transport layers and electron injection/transport layers, the cathode electrode 357 which is an electrode facing the anode electrode 359, and a sealing film 354 formed to cover the overall surface of the TFT substrate 300.

In this example, the blocking area 330 is configured to block passing of moisture between the display area 320 and the peripheral circuit area 340. The blocking area 330 includes a first blocking area 331 spread between the cathode electrode 357 and the glass substrate 351, and made of only an inorganic material, and a second blocking area 332 including the respective films of the first blocking area 331, and also having the light emitting organic layer 358. Because moisture entering from the external is advanced through an organic film, for example, the moisture that has entered the peripheral circuit area 340 can be prevented from entering the display area 320 with the provision of an area made of only an inorganic material.

Hereinafter, a method of manufacturing the configuration according to this embodiment will be described together with advantages of the configuration according to this embodiment.

Figure 4:
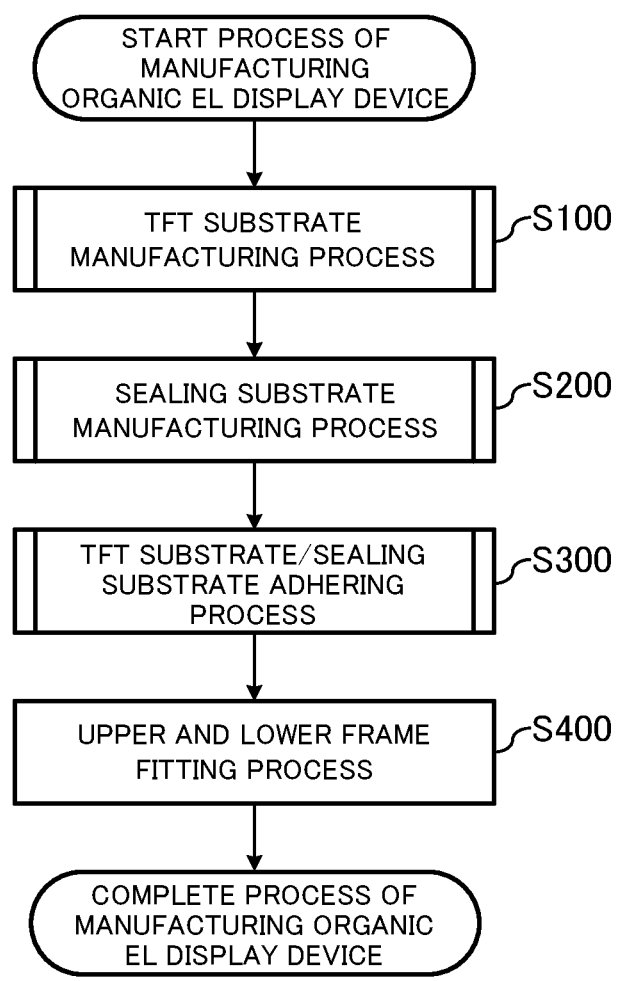
FIG. 4 is a flowchart illustrating a process of manufacturing the organic EL display device according to the embodiment of the present invention.

FIG. 4 is a flowchart illustrating a process of manufacturing the organic EL display device 100 according to the embodiment of the present invention. As illustrated in the flowchart, in the process of manufacturing the organic EL display device 100, the TFT substrate 300 is first manufactured in a TFT substrate manufacturing process S100, and a sealing substrate is sequentially manufactured in a sealing substrate manufacturing process S200. Then, in a TFT substrate/sealing substrate adhering process S300, the TFT substrate 300 and the sealing substrate thus manufactured are adhered to each other with a transparent resin, and in an upper and lower frame fitting process S400, external members (not shown) such as a COG and an FPC are implemented, and the upper frame 110 and the lower frame 120 are fitted to those components. With the above processes, the organic EL display device 100 is completed.

Figure 5:
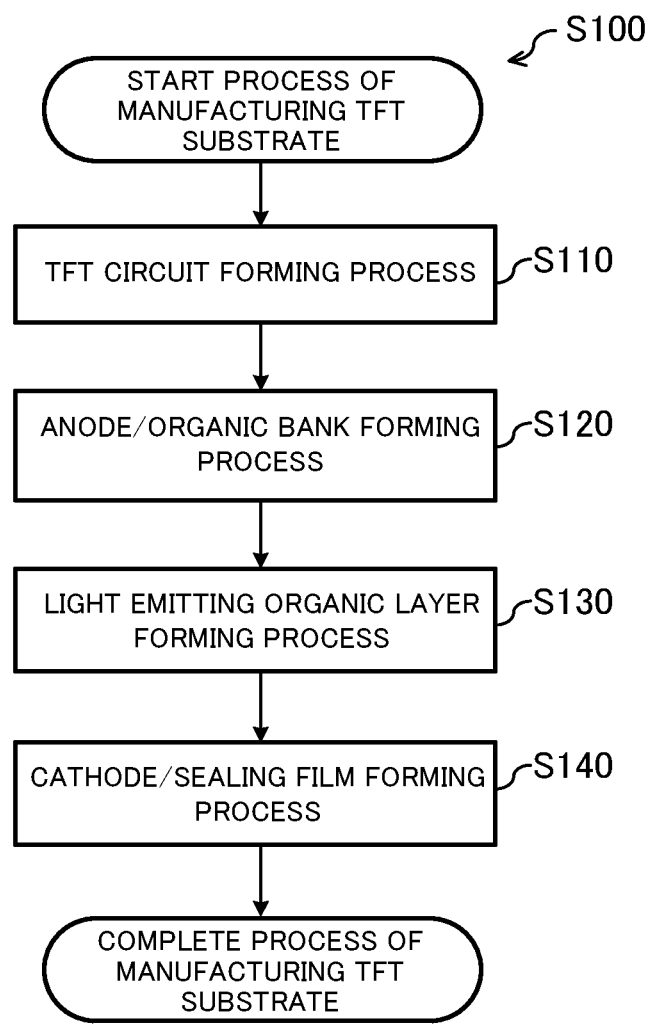
FIG. 5 is a flowchart illustrating the detail of a TFT substrate manufacturing process in FIG. 4.

FIG. 5 is a flowchart illustrating the detail of the TFT substrate manufacturing process S100 in FIG. 4. As illustrated in this flowchart, in the TFT substrate manufacturing process S100, a transistor circuit made of, for example, an LTPS is first formed in a TFT circuit forming process S110. The anode electrode 359 and the organic bank 356 are then formed in an anode/organic bank forming process S120. Sequentially, the light emitting organic layer 358 is formed by vapor deposition in a light emitting organic layer forming process S130. Finally, in a cathode/sealing film forming process S140, after the cathode electrode 357 that covers the display area 320, and extends to the peripheral circuit area 340 has been formed, the sealing film 354 that covers the overall surface of the substrate is formed to complete the TFT substrate 300.

Figure 6:
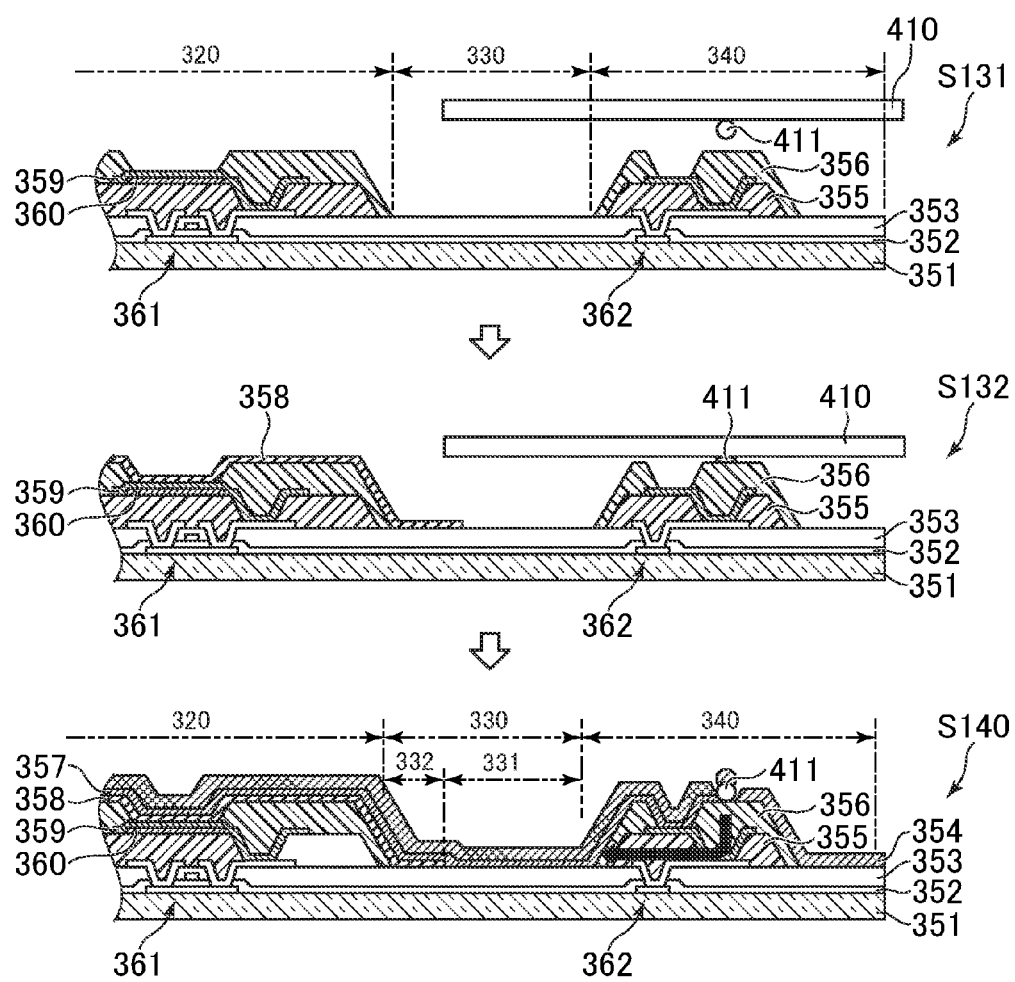
FIG. 6 is a diagram illustrating an light emitting organic layer forming process and a cathode/sealing film forming process in FIG. 5 in detail.

FIG. 6 is a diagram illustrating the detail of the light emitting organic layer forming process S130 and the cathode/sealing film forming process S140. As described above, the light emitting organic layer 358 is formed by so-called "vapor deposition". The vapor deposition is conducted in such a manner that a portion of the TFT substrate 300 where no film is formed is covered with an evaporation mask 410, and a film forming material is attached onto a portion of the TFT substrate 300 which is not covered with the evaporation mask 410. In this embodiment, the evaporation mask 410 that comes in contact with the peripheral circuit area 340, but comes out of contact with the display area 320 is used. Referring to FIG. 6, in order to describe the advantages of this embodiment, a case in which a foreign matter 411 is present in a portion corresponding to the peripheral circuit area 340 that comes in contact with the evaporation mask 410 will be described. First, in a mask loading process S131, the evaporation mask 410 is loaded on the TFT substrate 300. In this example, the inner end of the evaporation mask 410 is arranged in the blocking area 330 so that the light emitting organic layer 358 is formed within the blocking area 330, taking adhesion caused by go-around of the light emitting organic layer 358 in the deposition process into account. Then, in a deposition process S132, the light emitting organic layer 358 is deposited. In this process, it is assumed that the foreign matter 411 is transferred to the peripheral circuit area 340 from the evaporation mask 410. Finally, in the cathode/sealing film forming process S140, the cathode electrode 357 and the sealing film 354 are formed. However, because the sealing film 354 is not appropriately formed in a portion to which the foreign matter 411 adheres, the portion may configure an entry route of the moisture.

However, in the TFT substrate 300 according to this embodiment, because the cathode electrode 357 to the glass substrate 351 in the first blocking area 331 are made of only the inorganic material, moisture that has entered the peripheral circuit area 340 is blocked in the first blocking area 331 so that the moisture can be prevented from entering the display area 320, as indicated by an arrow in the figure. Therefore, there can be provided the organic EL display device that can suppress the display failure and maintain the quality for a long period.

Although the above-mentioned light emitting organic layer 358 may be formed by any number of layers, the light emitting organic layer 358 is generally configured by a plurality of layers. In this case, the deposition process using the above-mentioned evaporation mask 410 is repeated a plurality of times. Also, the plurality of layers may be configured by light emitting layers that emit light, or may be configured by a hole injection layer, a hole transport layer, an electron injection layer, or an electron transport layer. In particular, in the organic EL display device in which the overall surface of the display area 320 emit light with a single color such as white, the light emitting layer can be configured by the light emitting organic layer 358. In the organic EL display device in which the light emitting layers of RGB are formed for each of the pixels, separately, a common layer formed commonly to the respective pixels among the hole injection layer, the hole transport layer, the electron injection layer, and the electron transport layer may be formed by the light emitting organic layer 358.

Figure 7:
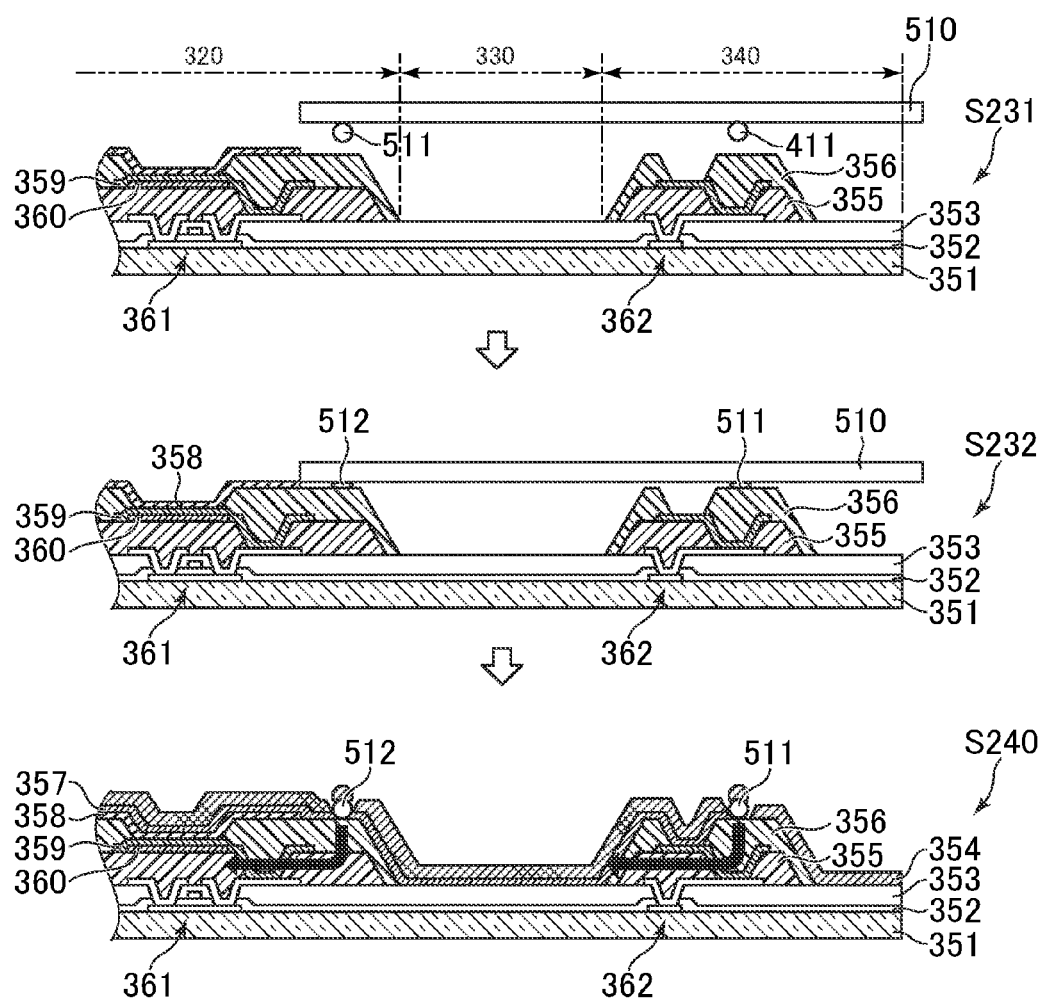
FIG. 7 is a diagram illustrating a light emitting organic layer forming process and a cathode/sealing film forming process of a TFT substrate according to a comparative example 1.

FIG. 7 is a diagram illustrating a light emitting organic layer forming process and a cathode/sealing film forming process of a TFT substrate according to a comparative example 1. The light emitting organic layer forming process and the cathode/sealing film forming process of the comparative example 1 are identical with those in FIG. 6 in that a mask loading process S231, a deposition process S232, and a cathode/sealing film forming process S240 are provided, but different therefrom in that an evaporation mask 510 is used. A mask portion of the evaporation mask 510 spreads from the peripheral circuit area 340 to a portion entering the display area 320. For that reason, the light emitting organic layer 358 formed in the deposition process S232 is formed to fall within the display area 320. Also, because it is conceivable that the mask portion of the evaporation mask 510 comes in contact with the display area 320 together with the peripheral circuit area 340, there is a need to consider a foreign matter 511 transferred in the display area 320 in addition to the foreign matter 411 transferred in the peripheral circuit area 340. Taking the foreign matter 511 into account, in the cathode/sealing film forming process S240, the foreign matter 511 is also transferred in the display area 320 in addition to the peripheral circuit area 340, as a result of which a portion where the sealing film 354 is not appropriately formed appears. Therefore, that portion may form an entry route of moisture. As described with reference to FIG. 6, the moisture entry route from the peripheral circuit area 340 can prevent the moisture from entering the display area 320 due to the existence of the blocking area 330. However, the entry route of the moisture in the display area 320 leads to the deterioration of the light emitting organic layer 358 as it is, and causes the display failure.

Figure 8:
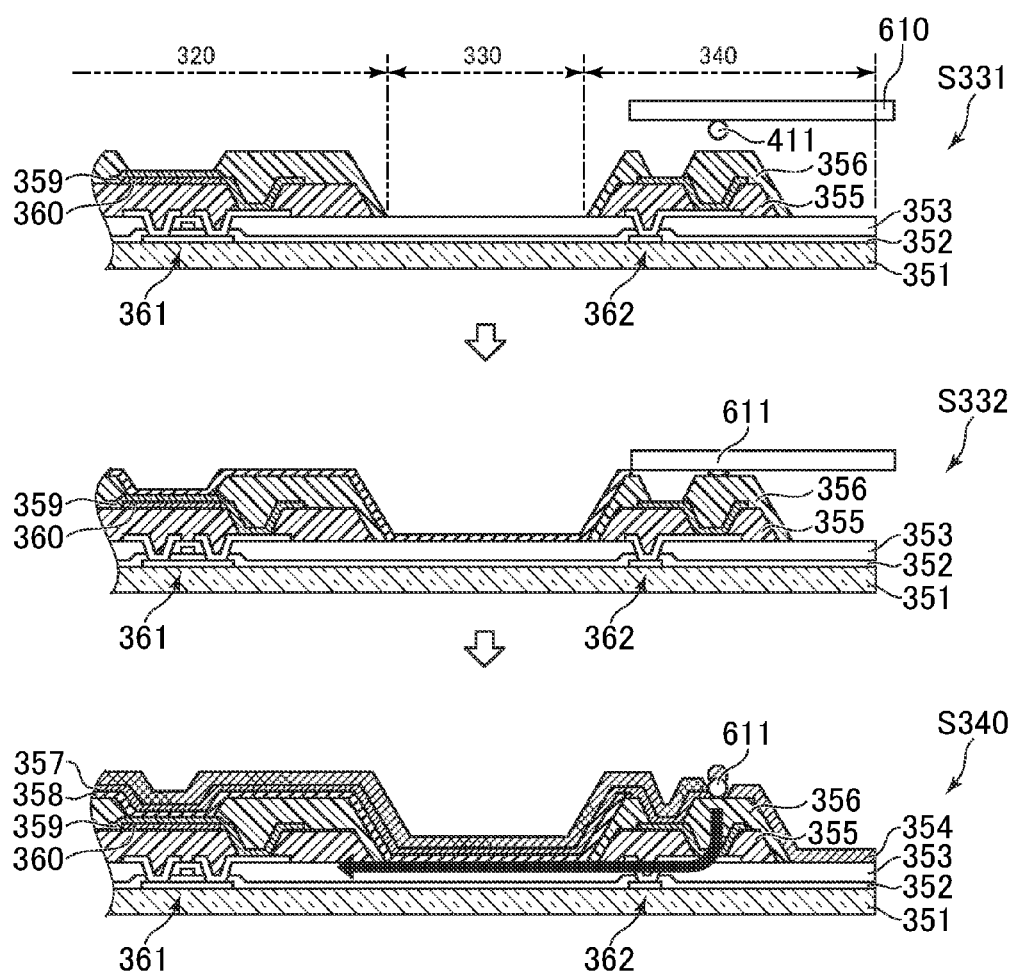
FIG. 8 is a diagram illustrating a light emitting organic layer forming process and a cathode/sealing film forming process of a TFT substrate according to a comparative example 2.

FIG. 8 is a diagram illustrating a light emitting organic layer forming process and a cathode/sealing film forming process of a TFT substrate according to a comparative example 2. The light emitting organic layer forming process and the cathode/sealing film forming process of the comparative example 2 are identical with those in FIG. 6 in that a mask loading process S331, a deposition process S332, and a cathode/sealing film forming process S340 are provided, but different therefrom in that an evaporation mask 610 is used. A mask portion of the evaporation mask 610 used in the comparative example 2 has a width fixed in the peripheral circuit area 340. For that reason, the light emitting organic layer 358 formed in the deposition process S332 is formed to spread to the peripheral circuit area 340 beyond the blocking area 330. Because it is conceivable that the mask portion of the evaporation mask 610 comes in contact with only the peripheral circuit area 340 as in FIG. 6, only the foreign matter 411 is considered as in FIG. 6. When the foreign matter 411 adheres to the peripheral circuit area 340, the sealing film 354 is not appropriately formed in the peripheral circuit area 340 in the cathode/sealing film forming process S340, and this portion may form the entry route of the moisture. In this example, because the light emitting organic layer 358 is formed beyond the blocking area 330, if the moisture enters from the moisture entry route of the peripheral circuit area 340, the moisture is not blocked in the blocking area 330, and deteriorates the light emitting organic layer 358 of the display area 320 through the light emitting organic layer 358, thus causing the display failure.

As has been described above, in the above-mentioned embodiment, the blocking area 330 of the TFT substrate 300 has the first blocking area 331 and the second blocking area 332. As a result, even if the moisture entry route is generated in the peripheral circuit area 340, the moisture can be prevented from entering the display area 320. Also, in the light emitting organic layer forming process causing the moisture entry route, the foreign matter can be prevented from being transferred from the evaporation mask to the display area 320. For that reason, the sealing film 354 of the display area 320 can be appropriately formed, and the moisture can be prevented from entering the display area 320. Therefore, the organic EL display device according to this embodiment can suppress the display failure due to the moisture entry of the display area from the outside periphery, and maintain the quality for a long period.

The above-mentioned embodiment can be applied to a light-emitting element display device using the organic light emitting material.

While there have been described what are at present considered to be certain embodiments of the invention, it will be understood that various modifications may be made thereto, and it is intended that the appended claim cover all such modifications as fall within the true spirit and scope of the invention.

What is claimed is:
1. A display device comprising:
a display area on a substrate;
a contact area outside of the display area on the substrate; and
a blocking area outside of the display area on the substrate, the display area comprises:

a plurality of first electrodes arranged in a matrix;

an organic insulating layer covering an edge of the first electrode and covering a clearance between two adjacent first electrodes, the organic insulating layer exposing a part of the first electrode;

an organic layer including a light emitting layer, the organic layer covering an exposed part of the first electrode;

a second electrode covering the organic layer and the organic insulating layer, the second electrode extending from the display area to the contact area and the blocking area; and a sealing film covering the second electrode, the sealing film extends from the display area to the contact area and the blocking area, the contact area comprises:

the organic insulating layer;

a metal wiring covered with the organic insulating layer; and an aperture in the organic insulating layer exposing a part of the metal wiring, the blocking area comprises:

a first blocking area configured by only one or a plurality of layers made of inorganic insulating material between the substrate and the sealing film; and a second blocking area configured by the layers configuring the first blocking area and the second electrode between the substrate and the sealing film, wherein the second electrode is electrically connected to the metal wiring at the aperture.

2. The display device according to claim 1, wherein the display area is surrounded by the blocking area.

3. The display device according to claim 1, wherein the display area has a rectangle shape, and the contact area extends along at least two sides of the display area.

4. The display device according to claim 1, wherein the block area further comprises a third blocking area configured by the layers configuring the second blocking area and a part of the organic layer.

5. The display device according to claim 1, wherein the organic layer further comprises any one of a hole injection layer, a hole transport layer, an electron injection layer, and an electron transport layer.

6. The display device according to claim 1, wherein a distance between the sealing layer and the substrate at the blocking area is smaller than a distance between the sealing layer and the substrate at the display area.

* * * * *